(12) United States Patent
Liang et al.

(10) Patent No.: US 10,338,178 B2
(45) Date of Patent: Jul. 2, 2019

(54) SYSTEM AND METHOD FOR HIGH-RESOLUTION SPECTROSCOPIC IMAGING

(71) Applicant: THE BOARD OF TRUSTEES OF THE UNIVERSITY OF ILLINOIS, Urbana, IL (US)

(72) Inventors: Zhi-Pei Liang, Champaign, IL (US); Fan Lam, Urbana, IL (US); Chao Ma, Charlestown, MA (US)

(73) Assignee: THE BOARD OF TRUSTEES OF THE UNIVERSITY OF ILLINOIS, Urbana, IL (US)

( * ) Notice: Subject to any disclaimer, the term of this patent is extended or adjusted under 35 U.S.C. 154(b) by 456 days.

(21) Appl. No.: 14/992,498

(22) Filed: Jan. 11, 2016

(65) Prior Publication Data

US 2016/0202336 A1    Jul. 14, 2016

Related U.S. Application Data

(60) Provisional application No. 62/102,315, filed on Jan. 12, 2015.

(51) Int. Cl.
    *G01V 3/00*      (2006.01)
    *G01R 33/561*    (2006.01)
    *G01R 33/485*    (2006.01)

(52) U.S. Cl.
    CPC ......... *G01R 33/561* (2013.01); *G01R 33/485* (2013.01); *G01R 33/5616* (2013.01)

(58) Field of Classification Search
    USPC ....................................................... 324/309
    See application file for complete search history.

(56) References Cited

U.S. PATENT DOCUMENTS

| | | | |
|---|---|---|---|
| 7,592,808 B1 | 9/2009 | King | |
| 8,148,979 B1 | 4/2012 | Du | |
| 8,965,487 B2 | 2/2015 | Bouma et al. | |

(Continued)

OTHER PUBLICATIONS

Adalsteinsson, E. et al., Volumetric Spectroscopic Imaging with Spiral-Based k-space Trajectories. Magn Reson Med; 1998; 39:889-898.

(Continued)

*Primary Examiner* — Rodney E Fuller
(74) *Attorney, Agent, or Firm* — Guntin & Gust, PLC; Matthew Tropper (57) ABSTRACT

Various embodiments accelerate high-resolution magnetic resonance spectroscopic imaging (MRSI). Various embodiments are built on a low-dimensional subspace model exploiting the partial separability of high-dimensional MRSI signals. For two and three dimensional MRSI with one spectral dimension, various embodiments sparsely sample the corresponding (k,t)-space in two complementary data sets, one with dense temporal sampling and high signal-to-noise ratio but limited k-space coverage and the other with sparse temporal sampling but extended k-space coverage. The reconstruction is then done by estimating a set of temporal/spectral basis functions and the corresponding spatial coefficients from these two data sets. The imaging technique of various embodiments can be used for high-resolution MRSI of different nuclei.

21 Claims, 6 Drawing Sheets

(56) References Cited

U.S. PATENT DOCUMENTS

| | | | | |
|---|---|---|---|---|
| 2004/0227512 | A1* | 11/2004 | Twieg | G01R 33/561 324/309 |
| 2008/0009703 | A1* | 1/2008 | Bito | G01R 33/485 600/410 |
| 2009/0115413 | A1* | 5/2009 | Senegas | G01R 33/5611 324/309 |
| 2010/0166604 | A1 | 7/2010 | Lim et al. | |
| 2013/0271140 | A1* | 10/2013 | Griswold | G01R 33/4826 324/316 |
| 2015/0323631 | A1* | 11/2015 | Asslaender | G01R 33/4616 324/309 |
| 2016/0044439 | A1 | 2/2016 | Mittal et al. | |

OTHER PUBLICATIONS

Barkhuijsen, H. et al., Improved Algorithm for Noniterative Time-Domain Model Fitting to Exponentially Damped Magnetic Resonance Signals; Journal of Magnetic Resonance; 1987; 73:553-557.

Brown, TR et al., NMR chemical shift imaging in three dimensions. Proc. Natl. Acad. Sci. USA, Jun. 1982; 79:3523-3526.

Bydder, M., Optimal Phased-array Combination for Spectroscopy; Magnetic Resonance Imaging 26 (2008) 847-850.

Chatnuntawech, Itthi et al., Undersampled Spectroscopic Imaging with Model-based Reconstruction; In Proceedings of the International Symposium on Magnetic Resonance in Medicine, Salt Lake City, Utah, USA, 2013. p. 3960.

Clifford, Bryan et al., Removal of Nuisance Signals from Limited and Sparse 3D H-MRSI Data of the Brain' May 30, 2015; 1 page.

Ebel, Andreas et al., Achieving Sufficient Spectral Bandwidth for Volumetric H Echo-Planar Spectroscopic Imaging at 4 Tesla. Magnetic Resonance in Medicine 2005; 54:697-701.

Eslami, Ramin et al., Robust Reconstruction of MRSI Data Using a Sparse Spectral Model and High Resolution MRI Priors; IEEE Transactions on Medical Imaging; 2010; 29:1297-1309.

Fu, Maojing et al., High-frame-rate Multislice Speech Imaging with Sparse Samping of (k,t)-space; Proc. Intl. Soc. Mag. Reson. Med. p. 20 (2012).

Guimaraes, AR et al., Echoplanar Chemical Shift Imaging. Magnetic Resonance in Medicine 41:877-882 (1999).

Haldar, Justin et al., Rank-Constrained Solutions to Linear Matrix Equations using PowerFactorization; IEEE Signal Processing Letters 2009; 16:584-587.

Haldar, Justin et al., Spatiotemporal Imaging with Partially Separable Functions: A Matrix Recovery Approach. In IEEE International Symposium on Biomedical Imaging, Rotterdam, Netherlands, 2010, pp. 716-719.

Haldar, Justin P. et al., Anatomically Constrained Reconstruction from Noisy Data; Magnetic Resonance in Medicine; 59:810-818 (2008).

Hu, Xiaoping et al., SLIM: Spectral Localization by Imaging; Magnetic Resonance in Medicine 8,314-322 (1988).

Jacob M. et al., Improved Model-Based Magnetic Resonance Spectroscopic Imaging; IEEE Transactions on Medical Imaging; 2007; 26:1305-1318.

Kasten, J. et al., Data-driven MRSI Spectral Localization Via Low-rank Component Analysis. IEEE Transactions on Medical Imaging; 2013; 32:1853-1863.

Kornak, John et al., Bayesian k-Space—Time Reconstruction of MR Spectroscopic Imaging for Enhanced Resolution; IEEE Transactions on Medical Imaging; vol. 29, No. 7, Jul. 2010.

Lam, Fan et al., A Subspace Approach to High-Resolution Spectroscopic Imaging; Magnetic Resonance in Medicine 71:1349-1357 (Feb. 4, 2014) pp. 1-9.

Lam, Fan, Denoising Diffusion-Weighted Magnitude MR Images Using Rank and Edge Constraints; Magnetic Resonance in Medicine 71:1272-1284 (2014).

Lam, Fan et al., High-Resolution H-MRSI of the Brain Using SPICE: Data Acquisition and Image Reconstruction; Oct. 28, 2015; pp. 1-11.

Lam, Fan et al., High-Resolution MR Spectroscopic Imaging; Aug. 26, 2014; 1 page.

Lam, Fan et al., Ultra-High Resolution 3D H-MRSI of the Brain: Subspace-Based Data Acquisitions and Processing; May 30, 2015; 1 page.

Lauterbur, PC, Zeugmatographic high resolution nuclear magnetic resonance spectroscopy: images of chemical inhomogeneity within macroscopic objects. Journal of the American Chemical Society; Nov. 12, 1975; 97:6866-6868.

Liang, Zhi_Pei, Spatiotemporal Imaging with Partially Separable Functions. In IEEE International Symposium on Biomedical Imaging, Arlington, VA, USA, 2007. pp. 988-991.

Liang, Zhi-Pei et al., "An Efficient Method for Dynamic Magnetic Resonance Imaging", IEEE Transactions on Medical Imaging, vol. 13, No. 4, Dec. 1994; pp. 1-10.

Liang, Zhi-Pei et al., A Generalized Series Approach to MR Spectroscopic Imaging; IEEE Transactions on Medical Imaging; 1991;10:132-137.

Lin, Fa-Hsuan et al., Sensitivity-Encoded (SENSE) Proton Echo-Planar Spectroscopic Imaging (PEPSI) in the Human Brain; Magnetic Resonance in Medicine 57:249-257 (2007).

Ma, Chao et al., High-Resolution H-MRSI of the Brain using Short-TE SPICE; May 30, 2015; 1 page.

Ma, Chao et al., Removal of Nuisance Signals from Limited and Sparse H MRSI Data Using a Union-of-Subspaces Model; Mar. 11, 2015; pp. 1-30.

Ma, Chao et al., Removal of the Nuisance Signals from H MRSI Data of the Brain; Aug. 26, 2014; 1 page.

Mansfield, P., Spatial Mapping of the Chemical Shift in NMR. Magnetic Resonance in Medicine; 1984; 1:370-386.

Maudsley, A.A. et al., Mapping of Brain Metabolite Distributions by Volumetric Proton MR Spectroscopic Imaging (MRSI). Magnetic Resonance in Medicine 61:548-559 (2009).

Maudsley, AA et al., Spatially resolved high resolution spectroscopy by "four-dimensional" NMR. Journal of Magnetic Resonance; 1983; 51:147-152.

Minka, Thomas P., Automatic choice of dimensionality for PCA; Adv Neural Inf Process Syst 2001; 13:598-604.

Mulkern, Robert V. et al., Echo Planar Spectroscopic Imaging. Concepts in Magnetic Resonance; 2001; 13:213-237.

Nguyen, Hien M. et al., Denoising MR Spectroscopic Imaging Data With Low-Rank Approximations; IEEE Transactions on Biomedical Engineering; 2013; 60:78-89.

Noll, Douglas C. et al., Conjugate Phase MRI Reconstruction With Spatially Variant Sample Density Correction; IEEE Transactions on Medical Imaging; 2005; 24:325-336.

Ogg, Robert et al., WET, a T1- and B1-Insensitive Water-Suppression Method for In Vivo Localized H NMR Spectroscopy. Journal of Magnetic Resonance, Series B 1994; 104:1-10; abstract only.

Peng, Xi et al., Correction of Field Inhomogeneity Effects on Limited k-Space MRSI Data using Anatomical Constraints; Conf Proc IEEE Eng Med Biol Soc 2010; 2010:883-886.

Pohlmann, R. et al., Theoretical evaluation and comparison of fast chemical shift imaging methods. Journal of Magnetic Resonance; 1997;129:145-160.

Posse, S. et al., Proton Echo-Planar Spectroscopic Imaging of J-coupled Resonances in Human Brain at 3 and 4 Tesla. Magnetic Resonance in Medicine; 2007; 58:236-244.

Posse, Stefan et al., High speed H Spectroscopic Imaging in Human Brain by Echo Planar Spatial-Spectral Encoding. Magn Reson Med; 1995; 33:34-40.

Posse, Stefan et al., MR spectroscopic imaging: Principles and Recent Advances. Journal of Magnetic Resonance Imaging; 2013; 37:1301-1325.

Schirda, CV et al., Rosette Spectroscopic Imaging: Optimal Parameters for Alias-Free, High Sensitivity Spectroscopic Imaging. Journal of Magnetic Resonance Imaging; 29:1375-1385 (2009).

Tsai, Shang-Yueh, Accelerated Proton Echo Planar Spectroscopic Imaging (PEPSI) Using GRAPPA with a 32-Channel Phased-Array Coil; Magnetic Resonance in Medicine 59:989-998 (2008).

(56) References Cited

OTHER PUBLICATIONS

Ulfarsson, Magnus O., Dimension Estimation in Noisy PCA With SURE and Random Matrix Theory; IEEE Transactions on Signal Processing; 2008; 56:5804-5816.

Zhang, Yi et al., Magnetic resonance Spectroscopy with Linear Algebraic Modeling (SLAM) for higher speed and sensitivity; Journal of Magnetic Resonance; 2012;218:66-76.

Zhao, Bo et al., Highly accelerated parameter mapping with joint partial separability and sparsity constraints. In Proceedings of the International Symposium on Magnetic Resonsance in Medicine, Melbourne, Australia, May 5, 2012. p. 2233.

Zhao, Bo et al., Image Reconstruction From Highly Undersampled (k,t) Space Data With Joint Partial Separability and Sparsity Constraints; IEEE Transactions on Medical Imaging; vol. 31, No. 9, Sep. 2012.

International Search Report & Written Opinion for PCT/US18/047774 dated Dec. 11, 2018.

Provencher, Stephen W., "Estimation of Metabolite Concentrations from Localized in Vivo Proton NMR Spectra", Quantification of Localized In Vivo H Spectra, MRM 30:672-679, 1993.

\* cited by examiner

SYSTEM AND METHOD FOR HIGH-RESOLUTION SPECTROSCOPIC IMAGING

CROSS-REFERENCE TO RELATED APPLICATIONS

This application claims the benefit of U.S. Provisional Application Ser. No. 62/102,315, filed Jan. 12, 2015, which is incorporated by reference herein in its entirety including Appendices.

GOVERNMENT RIGHTS

This invention was made with government support under contract number EB013695 awarded by the National Institutes of Health. The government has certain rights in the invention.

FIELD OF THE DISCLOSURE

The present disclosure generally relates to magnetic resonance spectroscopic imaging.

BACKGROUND

This disclosure relates generally to diagnostic imaging and, more particularly, to an apparatus and method of high resolution magnetic resonance spectroscopic imaging.

When a substance such as human tissue is subjected to a uniform magnetic field (such as a polarizing field $B_0$), the individual magnetic moments of the spins in the tissue attempt to align with this polarizing field, but precess about it in random order at their characteristic Larmor frequency. If the substance, or tissue, is subject to a magnetic field (excitation field $B_1$) in the x-y plane and which is near the Larmor frequency, the net aligned moment, or "longitudinal magnetization", $M_z$, may be rotated or "tipped" into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method used. The resulting set of received signals are digitized and processed to reconstruct the image using one of many known reconstruction techniques.

Magnetic resonance spectroscopic imaging (MRSI) is a noninvasive imaging method that provides spectral information in addition to the structural information that is generated by magnetic resonance imaging (MRI) alone. Traditional MRI generates a black-and-white image in which brightness is determined primarily by the water molecule concentrations, and the T1 and/or T2 relaxation times of the tissue being imaged; the spectral information obtained in MRSI provides additional information about metabolic activity. MRSI can be performed on a standard MRI scanner, and has broad applications in medicine, oncology, and general physiological studies. And, when hydrogen is the target element, MRSI is also called 1H-nuclear magnetic resonance spectroscopic imaging and proton magnetic resonance spectroscopic imaging. Similarly, we have 31P magnetic resonance spectroscopic imaging and 13C magnetic resonance spectroscopic imaging.

MRSI has been recognized as a powerful tool for noninvasive metabolic studies, but clinical and research applications of this technology have been developing more slowly than expected. Reasons for the slow development of the technology include but are not limited to long data acquisition time, poor spatial resolution, and low signal-to-noise ratio (SNR), as examples.

Significant efforts have been made to address the above issues, resulting in a large number of new data acquisition and reconstruction methods for spectroscopic imaging. For fast data acquisition, one approach is to incorporate echoplanar-type of data acquisition schemes with spectroscopic imaging. Many methods (and pulse sequences) have been proposed to implement this data acquisition strategy. And, although echo-planar spectroscopic imaging (EPSI) methods can significantly reduce the data acquisition time for spatiospectral encoding, it is at the expense of SNR. Another approach to accelerated spectroscopic imaging is to use parallel imaging in which parallel data acquisition occurs using phased array coils.

Advanced MRSI reconstruction has focused on using prior information to compensate for the lack of sufficient measurements or SNR. To this end, a number of reconstruction models have been proposed, but reconstruction methods alone may not provide adequate levels of improvements in spatial resolution, data acquisition speed, and SNR needed to have a major impact on in vivo MR spectroscopic imaging.

As such, there is a need for improved MR spectroscopic imaging.

BRIEF DESCRIPTION

Embodiments are directed toward a method and apparatus to enable high-speed, high-resolution MR spectroscopic imaging.

According to one aspect, a device to acquire magnetic resonance spectroscopic imaging (MRSI) data includes a plurality of gradient coils positioned about a bore of a magnet, an RF transceiver controlled by a pulse module to transmit RF signals to an RF coil assembly and receive imaging data, and a computer. The computer can be programmed to control the data acquisition system of an MRI scanner to acquire MRSI data with special sampling patterns in (k,t)-space (corresponding to special spatiospectral encoding strategies). One unique feature of the disclosed sampling patterns is variable sampling densities in (k,t)-space to enable high-speed MRSI data acquisition with sparse sampling in k-space and/or time; another unique feature of the disclosed sampling patterns is that it enables the use of subspace (or low-rank matrix/tensor) models to recover high-quality, high-resolution spatiospectral functions from sparsely sampled (k,t)-space MRSI data. The MRSI data collected using such sampling schemes can be rearranged in multiple ways. One way is to organize the acquired MRSI data into two data sets: one data set (called "training" data) with relatively high SNR, and high temporal resolution (often covering central k-space region), and another data set (called "imaging" data) with extended k-space coverage to achieve high spatial resolution. The "imaging" data can sample k-space and/or time sparsely with or without signal averaging to achieve high-speed data acquisition.

According to another aspect, a method of magnetic resonance spectroscopic imaging (MRSI) that builds on subspace (or low-rank matrix/tensor) models and uses the models for data acquisition, processing and image reconstruction, wherein a corresponding (k,t)-space is sparsely sampled in variable density and variable SNR that enable high-speed data acquisition while providing sufficient data for determination of subspace structures and for recovery of high-quality, high-resolution spatiospectral functions using low-rank matrix/tensor models. Various other features and advantages will be made apparent from the following detailed description and the drawings.

DETAILED DESCRIPTION

An apparatus and method is provided that acquires multiple 2D or 3D MRSI data sets using special spatiospectral encoding schemes that cover (k,t)-space sparsely. These data enable the recovery of high-quality, high-resolution spatiospectral functions using subspace (or low-rank matrix/tensor) models. The spatiospectral information thus obtained provides biochemical information of the object being imaged.

The following definitions can be utilized by one or more of the exemplary embodiments.

A device and/or method is provided for acquiring spatiospectral distributions from an object. A magnetic field generator can generate a strong static magnetic field where the object is arranged in. A plurality of gradient coils can be positioned about a bore of a magnet. An RF transceiver can be controlled by a pulse module to transmit RF signals to an RF coil assembly and to receive imaging data. A computer can control the data acquisition system to acquire sparsely sampled (k,t)-space data and can reconstruct spatiospectral functions from the sparsely sampled (k,t)-space data.

One or more of the exemplary embodiments can utilize modeling of the spatiospectral function of interest using a Partial Separability (PS) model as $$\rho(x_1, x_2, \ldots, x_d) = \sum_{l=1}^{L} \phi_{l,1}(x_1)\phi_{l,2}(x_2) \ldots \phi_{l,\hat{d}}(x_{\hat{d}}), \quad (I)$$

where $x_1, x_2, \ldots x_{\hat{d}}$ are $\hat{d}$ separable groups of the complete set of variables $x_1, x_2, \ldots, x_d$ for the image domain, such that $x_i = (x_{i_1}, x_{i_2}, \ldots x_{i_m})$.

For $\hat{d} > 2$, the model in Eq. (I) can be generalized as $$\rho(x_1, x_2, \ldots, x_d) = \sum_{l_1=1}^{L_1} \sum_{l_2=1}^{L_2} \ldots \sum_{l_{\hat{d}}=1}^{L_{\hat{d}}} c_{l_1 l_2 \ldots l_{\hat{d}}} \phi_{l_1}(x_1)\phi_{l_2}(x_2) \ldots \phi_{l_{\hat{d}}}(x_{\hat{d}}), \quad (II)$$

which is equivalent to the form in Eq. (I) for $\hat{d} \leq 2$. Note that both Eq. (I) and Eq. (II) represent a subspace model that is the basis of the data acquisition and reconstruction schemes associated with the exemplary embodiments.

The model in Eqs. (I) and (II) can be expressed in different forms for magnetic resonance spectroscopic imaging (MRSI) in different contexts, specifically a) For 2D MRSI, we have $$\rho(r,t)=\rho(x,y,t)=\Sigma_{l=1}^{L}c_l(r)\psi_l(t) \text{ or } \rho(r,f)=\rho(x,y,f)=\Sigma_{l=1}^{L}c_l(r)\psi_l(f),$$

where $\{\psi_l(t)\}_{l=1}^{L}$ represents the temporal subspace, $(\{\psi_l(f)\}_{l=1}^{L}$ the spectral subspace), $\{c_l(r)\}_{l=1}^{L}$ the corresponding spatial coefficients (or the spatial subspace), r contains the spatial variables, and t and f denote the temporal and the corresponding spectral variables, respectively;

b) For 3D MRSI, we have the same model as in a) but with r=(x,y,z).

c) Additionally, the spatial subspace $\{c_l(r)\}_{l=1}^{L}$ can be further expanded as $c_l(r)=\Sigma_{l'=1}^{L'}\phi_{l'}(x)\phi_{l'}(y)$ or $c_l(r)=\Sigma_{l'=1}^{L'}\phi_{l'}(x)\phi_{l'}(y)\phi_{l'}(z)$ if desired.

d) For 2D or 3D MRSI, $\rho(r,t)$ or $\rho(r,f)$ over sampled points $\{(r_p,t_q)\}_{p,q=1}^{P,Q}$ can be represented in a matrix form as:

$$\begin{bmatrix} \rho(r_1, t_1) & \rho(r_1, t_2) & \ldots & \rho(r_1, t_Q) \\ \rho(r_2, t_1) & \rho(r_2, t_2) & \ldots & \rho(r_2, t_Q) \\ \vdots & \vdots & \ddots & \vdots \\ \rho(r_P, t_1) & \rho(r_P, t_2) & \ldots & \rho(r_P, t_Q) \end{bmatrix}$$

The rank of such a matrix will be upper-bounded by L.

e) For higher-dimensional MRSI, such as dynamic MRSI or MRSI with multiple spectral dimensions, the spatiospectral function $\rho(x_1, x_2, \ldots, x_d)$ over a set of sampled points can be represented in a tensor form as:

$$\begin{bmatrix} \rho(x_{1,1}, x_{2,1}, x_{3,K}) & \rho(x_{1,1}, x_{2,2}, x_{3,K}) & \ldots & \rho(x_{1,1}, x_{2,J}, x_{3,K}) \\ \rho(x_{1,2}, x_{2,1}, x_{3,K}) & \rho(x_{1,2}, x_{2,2}, x_{3,K}) & \ldots & \rho(x_{1,2}, x_{2,J}, x_{3,K}) \\ \vdots & \vdots & \ddots & \vdots \\ \rho(x_{1,I}, x_{2,1}, x_{3,K}) & \rho(x_{1,I}, x_{2,2}, x_{3,K}) & \ldots & \rho(x_{1,I}, x_{2,J}, x_{3,K}) \end{bmatrix}$$

-continued $$\begin{bmatrix} \rho(x_{1,1}, x_{2,1}, x_{3,2}) & \rho(x_{1,1}, x_{2,2}, x_{3,2}) & \cdots & \rho(x_{1,1}, x_{2,J}, x_{3,2}) \\ \rho(x_{1,2}, x_{2,1}, x_{3,2}) & \rho(x_{1,2}, x_{2,2}, x_{3,2}) & \cdots & \rho(x_{1,2}, x_{2,J}, x_{3,2}) \\ \vdots & \vdots & \ddots & \vdots \\ \rho(x_{1,I}, x_{2,1}, x_{3,2}) & \rho(x_{1,I}, x_{2,2}, x_{3,2}) & \cdots & \rho(x_{1,I}, x_{2,J}, x_{3,2}) \end{bmatrix}$$

$$\begin{bmatrix} \rho(x_{1,1}, x_{2,1}, x_{3,1}) & \rho(x_{1,1}, x_{2,2}, x_{3,1}) & \cdots & \rho(x_{1,1}, x_{2,J}, x_{3,1}) \\ \rho(x_{1,2}, x_{2,1}, x_{3,1}) & \rho(x_{1,2}, x_{2,2}, x_{3,1}) & \cdots & \rho(x_{1,2}, x_{2,J}, x_{3,1}) \\ \vdots & \vdots & \ddots & \vdots \\ \rho(x_{1,I}, x_{2,1}, x_{3,1}) & \rho(x_{1,I}, x_{2,2}, x_{3,1}) & \cdots & \rho(x_{1,I}, x_{2,J}, x_{3,1}) \end{bmatrix}$$

or $\mathcal{T}\{(x_{1,i_1}, x_{2,i_2}, \ldots, x_{d,i_d})\}_{i_1,i_2,\ldots,i_d=1}^{I_1,I_2,\ldots,I_d}$.

Partial separability of the underlying spatiospectral function implies that the tensor will be rank-deficient. In other words, although the tensor, in general, is in a very high-dimensional space; those tensors representing meaningful spatiospectral functions reside in a very low-dimensional subspace. This property is effectively utilized in the disclosed method to achieve high-speed, high-resolution MRSI.

Figure 1:
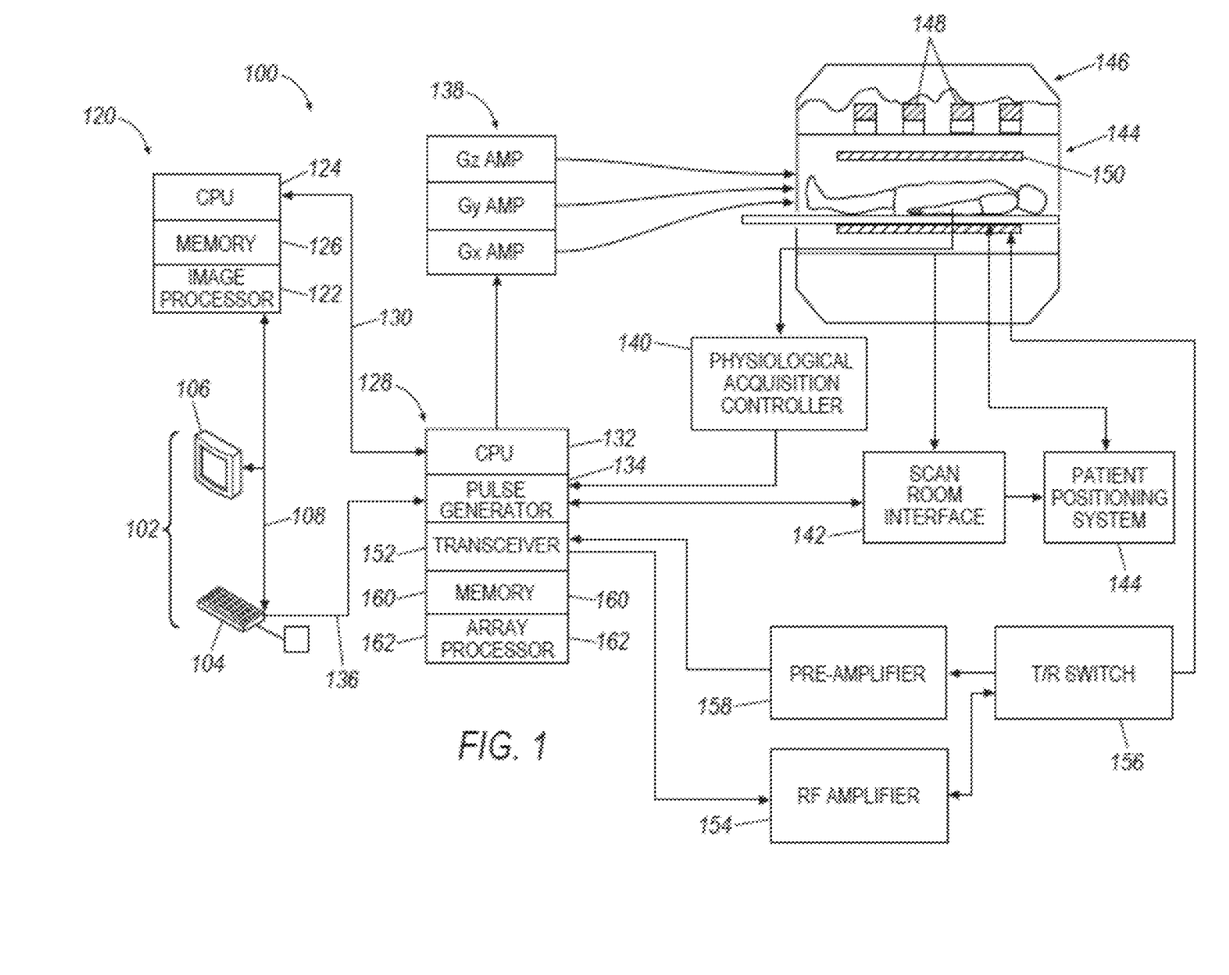
FIG. 1 is a schematic block diagram of an exemplary imaging system incorporating embodiments of the present disclosure.

The data generation process in general magnetic resonance imaging experiments can be modeled as $$s(k_{x_1}, k_{x_2}, \ldots, k_{x_{\hat{d}}}) = \int\int \cdots \int \rho(x_1, x_2, \ldots, x_{\hat{d}}) e^{-i2\pi(k_{x_1} \cdot x_1 + k_{x_2} \cdot x_2 + \cdots + k_{x_{\hat{d}}} \cdot x_{\hat{d}})} dx_1 dx_2 \ldots dx_{\hat{d}}, \quad \text{(III)}$$

where $k_{x_1}, k_{x_2}, \ldots, k_{x_{\hat{d}}}$ are $\hat{d}$ separable groups of the complete set of variables $k_1, k_2, \ldots, k_d$ for the data domain, such that $k_{x_i} = (k_{i_1}, k_{i_2}, \ldots k_{i_m})$. Furthermore, Eq. (III) can be rewritten as a) $s(k,t) = s(k_x, k_y, t) = \iint \rho(x,y,t) e^{-i2\pi(k_x x + k_y y)} dx dy$ or
$s(k,t) = s(k_x, k_y, t) = \iint (\int \rho(x,y,f) e^{-i2\pi ft} df) e^{-i2\pi(k_x x + k_y y)} dx dy$ for 2D MRSI;

b) $s(k,t) = s(k_x, k_y, k_z, t) = \iiint \rho(x,y,z,t) e^{-i2\pi(k_x x + k_y y + k_z z)} dx dy dz$ or
$s(k,t) = s(k_x, k_y, k_z, t) = \iiint \rho(x,y,z,f) e^{-i2\pi ft} df) e^{-i2\pi(k_x x + k_y y + k_z z)} dx dy dz$ for 3D MRSI;

Referring to FIG. 1, major components of an exemplary magnetic resonance imaging (MRI) system 100 incorporating embodiments of the disclosure are shown. Operation of the system can be controlled from an operator console 102 which includes a keyboard or other input device 104, and a display screen 106. Console 102 communicates through a link 108 with a separate computer system 120 that enables an operator to control the production and display of images on display screen 106. Computer system 120 includes a number of modules which communicate with each other through a backplane (not shown). These include an image processor module 122, a CPU module 124 and a memory module 126 that may include a frame buffer for storing image data arrays. Computer system 120 can be linked to archival media devices, permanent or back-up memory storage or a network for storage of image data and programs, and communicates with a separate system control 128 through a high speed serial link 130. The input device 104 can include a mouse, joystick, keyboard, track ball, touch activated screen, light wand, voice control, or any similar or equivalent input device, and may be used for interactive geometry prescription.

System control 128 includes a set of modules connected together by a backplane (not shown). These include a CPU module 132 and a pulse generator module 134 which connects to the operator console 102 through a serial link 136. It can be through link 136 that the system control 128 receives commands from the operator to indicate a scan sequence that is to be performed. The pulse generator module 134 operates the system components to carry out the desired scan sequence and produces data which indicates the timing, strength and shape of the RF pulses produced, and the timing and length of the data acquisition window. The pulse generator module 134 connects to a set of gradient amplifiers 138, to indicate the timing and shape of the gradient pulses that are produced during the scan. The pulse generator module 134 can also receive patient data from a physiological acquisition controller 140 that receives signals from a number of different sensors connected to the patient, such as ECG signals from electrodes attached to the patient. The pulse generator module 134 connects to a scan room interface circuit 142 which receives signals from various sensors associated with the condition of the patient and the magnet system. It is also through the scan room interface circuit 142 that a patient positioning system 144 receives commands to move the patient to the desired position for the scan.

The gradient waveforms produced by the pulse generator module 134 are applied to the gradient amplifier system 138 having Gx, Gy, and Gz amplifiers. Each gradient amplifier excites a corresponding physical gradient coil in a gradient coil assembly generally designated 144 to produce the magnetic field gradients used for spatially encoding acquired signals. The gradient coil assembly 144 forms part of a magnet assembly 146 which includes a polarizing magnet 148 and a whole-body RF coil 150. In one embodiment, RF coil 150 can be a multi-channel coil. A transceiver module 152 in the system control 128 produces pulses which are amplified by an RF amplifier 154 and coupled to RF coil 150 by a transmit/receive switch 156. The resulting signals emitted by the excited nuclei in the patient may be sensed by the same RF coil 150 and coupled through the transmit/receive switch 156 to a preamplifier 158. The amplified MR signals are demodulated, filtered, and digitized in the receiver section of the transceiver 152. The transmit/receive switch 156 can be controlled by a signal from the pulse generator module 134 to electrically connect the RF amplifier 154 to the RF coil 150 during the transmit mode and to connect the preamplifier 158 to the RF coil 150 during the receive mode. The transmit/receive switch 156 can also enable a separate RF coil (for example, a surface coil) to be used in either transmit or receive mode.

The MR signals picked up by the multi-channel RF coil 150 are digitized by the transceiver module 152 and transferred to a memory module 160 in the system control 128. A scan can be complete when an array of raw k-space data has been acquired in memory module 160. This raw k-space data can be rearranged into separate k-space data arrays for each image to be reconstructed, and each of these can be input to an array processor 162 which operates to Fourier transform the data into an array of image data. This image data can be conveyed through serial link 130 to computer system 120 where it can be stored in memory 126. In response to commands received from operator console 102, image data may be archived in long term storage or it may be further processed by image processor 122 and conveyed to operator console 102 and presented on display 106.

Magnetic resonance spectroscopy (MRS) is used to measure the levels and changes of different metabolites in body tissues. The MR signal produces a spectrum of resonances that corresponds to different molecular arrangements of the isotope being "excited". This signature is used to diagnose certain metabolic disorders, such as those affecting the brain, and to provide information on tumor metabolism.

Magnetic resonance spectroscopic imaging (MRSI) combines both spectroscopic and imaging methods to produce spatially localized spectra from within the sample or patient. The spatial resolution may be lower (limited by the available SNR), but the spectra in each voxel contains information about many metabolites. Because the available signal is used to encode spatial and spectral information, MRSI is typically deemed as a slow imaging modality and prefers higher field strengths, such as 3T and above, to achieve desirable SNR.

The disclosed method accelerates spectroscopic imaging using sparse sampling of (k,t)-space and subspace (or low-rank) modeling to enable high-resolution metabolic imaging with good SNR by exploiting a unique property known as partial separability (PS) of spectroscopic signals. This property indicates that high-dimensional spectroscopic signals reside in a very low-dimensional subspace and enables special data acquisition and image reconstruction strategies to be used to obtain high-resolution spatiospectral distributions from the imaging object with good SNR. More specifically, a variable density sampling pattern is disclosed for sparse sampling of (k,t)-space, which can be implemented in practical experiments using a 2D or 3D hybrid chemical shift imaging (CSI) and echo-planar spectroscopic imaging (EPSI) pulse sequence or a variable density 2D or 3D EPSI sequence; and a PS/low-rank model-based algorithm is disclosed for subspace estimation and image reconstruction from sparse data with the capability to incorporate prior information and field inhomogeneity correction. In one example, an EPSI pulse sequence is used having a range of readout bandwidth that allows for a customized EPSI sequence such that an echo spacing does not satisfy a spectral Nyquist criterion. In another example, a set of navigator data is included for correcting bipolar effects from the EPSI readouts.

In practical 2D/3D spectroscopic imaging experiments, the measured data can be further modeled as (based on the data acquisition equations described above):

$$s_c(k, t) = \int_V \int_{\Omega_f} \rho(r, f) S_c(r) e^{-i2\pi ft} e^{-i\gamma \Delta B(r)t} e^{-i2\pi kr} df\, dr + \xi(k, t) \quad \text{(IV)}$$
$$= \int_V \rho(r, t) S_c(r) e^{-i\gamma \Delta B(r)t} e^{-i2\pi kr} dr + \xi(k, t),$$

where $\rho(r,f)$ is the desired 2D/3D spatiospectral function, $S_c(r)$ the sensitivity profile of the cth acquisition coil (with c being the coil index), V the excited volume of interest, $\Omega_f$ the spectral bandwidth, $\gamma$ the gyromagnetic ratio, $\xi(k,t)$ the measurement noise (often assumed to be white Gaussian), and $\Delta B(r)$ the $B_0$ field inhomogeneity (referred to as field inhomogeneity hereafter).

The disclosed method exploits an important property of $\rho(r,t)$, known as spatiotemporal partial separability (PS). More specifically, $\rho(r,t)$ may be expressed as:

$$\rho(r, t) = \sum_{l=1}^{L} c_l(r) \phi_l(t),$$

where $\{\phi_l(t)\}_{l=1}^{L}$ can be viewed as a set of temporal basis functions, $\{c_l(r)\}_{l=1}^{L}$ are the corresponding spatial coefficients (which can also be viewed as spatial basis), and L is the model order (also called the order of separability). In spectroscopic imaging, the PS model may be used because the object imaged has a finite (L) number of tissue types, each of which has a distinct spectral signatures. It has been shown that PS implies matrix or tensor low-rankness. For example, a Casorati matrix formed from $\rho(r,t)$ over any point set $\{(r_p, t_q)\}_{p,q=1}^{P,Q}$:

$$C\{\rho(r_p, t_q)\}_{p,q=1}^{P,Q} = \begin{bmatrix} \rho(r_1, t_1) & \rho(r_1, t_2) & \cdots & \rho(r_1, t_Q) \\ \rho(r_2, t_1) & \rho(r_2, t_2) & \cdots & \rho(r_2, t_Q) \\ \vdots & \vdots & \ddots & \vdots \\ \rho(r_P, t_1) & \rho(r_P, t_2) & \cdots & \rho(r_P, t_Q) \end{bmatrix},$$

has a rank upper-bounded by L. This implies that $\rho(r,t)$ resides in a low-dimensional space (or has a small number of degrees of freedom). More specifically, assume that $\rho(r,t)$ can be represented by $\{\rho(r_m, t_n)\}_{m,n=1}^{M,N}$ in a conventional pixel representation. Then, when viewed as a vector (formed from $p(r_m, t_n)$), it resides in a M N-dimensional space. However, the PS property implies that $\{\rho(r_m, t_n)\}_{m,n=1}^{M,N}$ actually resides in a very low-dimensional subspace (spanned by $\{\phi_l(t)\}_{l=1}^{L}$, for example). This property enables special data acquisition and image reconstruction strategies to be used to obtain high-resolution spatiospectral distributions with good SNR.

Data Acquisition: Extended (k,t) Coverage with Variable Density Sparse Sampling

Figure 2A:
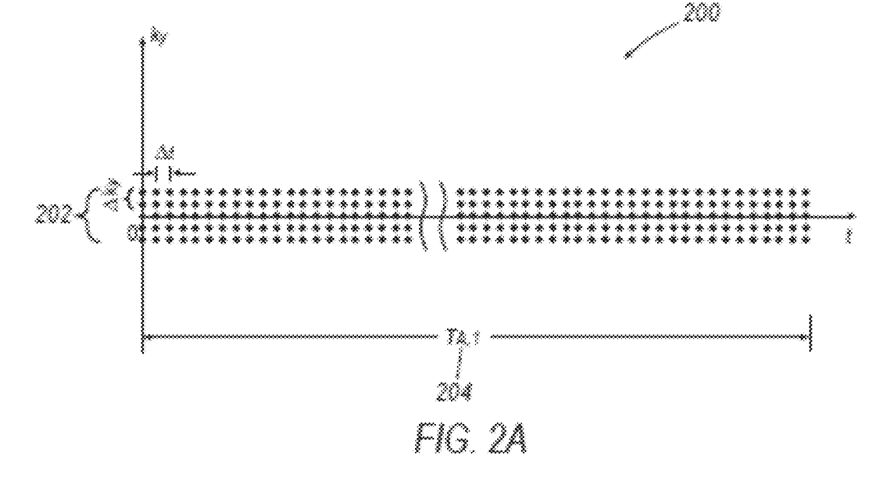
FIG. 2A illustrates an exemplary (k,t)-space sampling for the "training" data, also denoted as $D_1$.
Figure 2B:
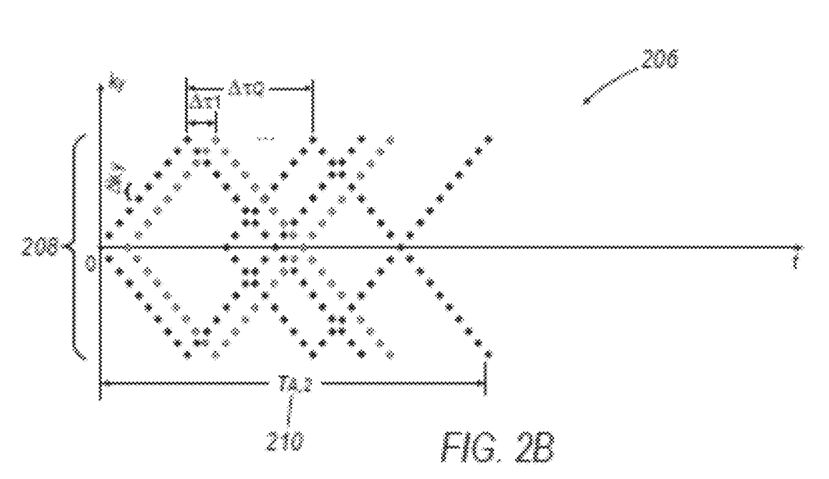
FIG. 2B illustrates an exemplary (k,t)-space sampling for the "imaging" data also denoted as $D_2$.
Figure 3A:
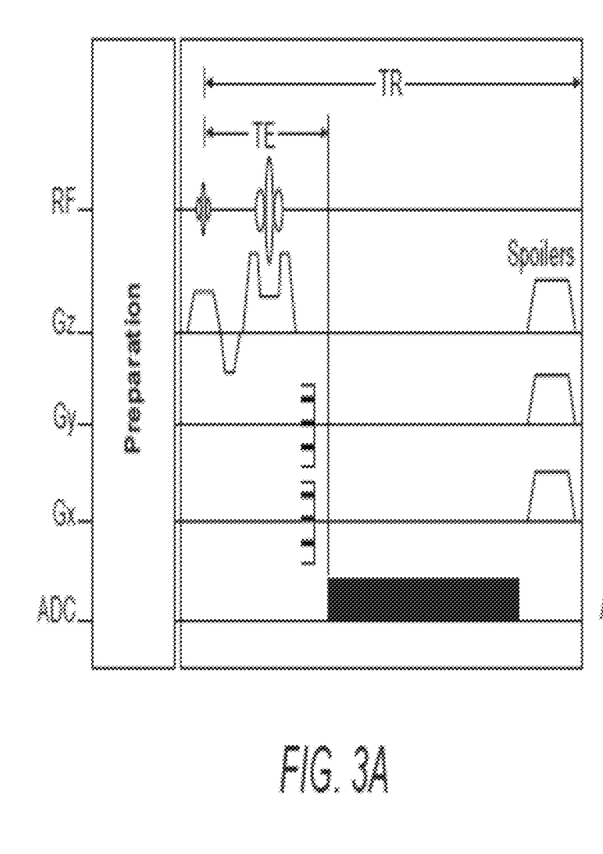
FIG. 3A illustrates an exemplary CSI used to collect the data in $D_1$ with limited k-space coverage but full spectral encoding.
Figure 3B:
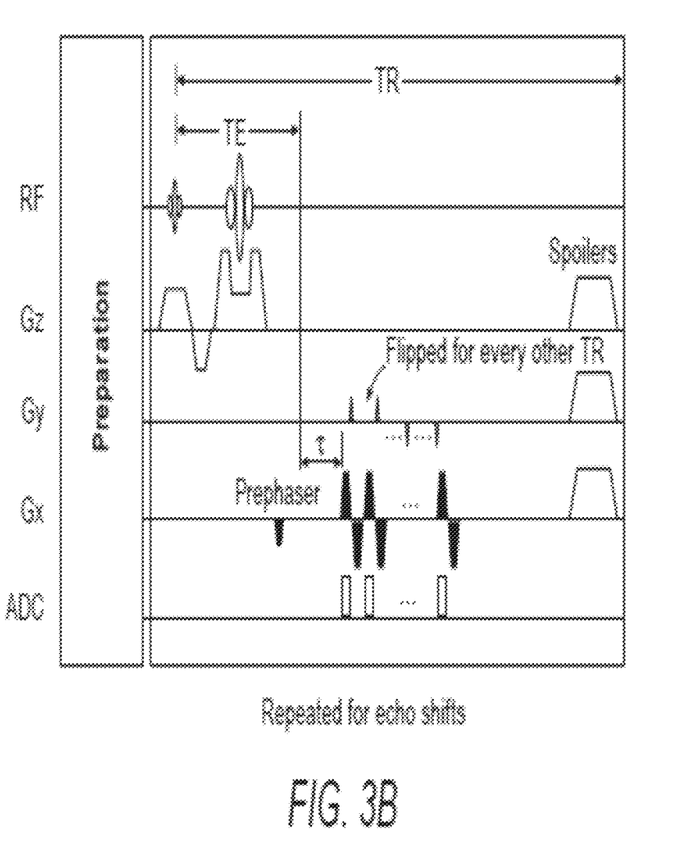
FIG. 3B illustrates an EPSI-like component used to acquire the date in $D_2$ with extended k-space coverage, but with limited spectral encoding.

To exploit the PS property for high-speed, high-resolution spectroscopic imaging, the disclosed method uses a special data acquisition (or spatiospectral encoding) strategy to achieve extended (k,t) coverage with sparse sampling and variable density. While there are many practical ways to implement the disclosed PS-based data acquisition (spatiospectral encoding) strategy, one unique feature of the disclosed sampling patterns is variable sampling densities in (k,t)-space to enable high-speed MRSI data acquisition with sparse sampling in k-space and/or time; another unique feature of the disclosed sampling patterns is that it enables the use of subspace (or low-rank matrix or tensor) models to recover high-quality, high-resolution spatiospectral functions from sparsely sampled (k,t)-space MRSI data. The MRSI data collected using such sampling schemes can be rearranged in multiple ways. One way is to organize the acquired MRSI data into two data sets: one data set (called "training" data, denoted as $D_1$) with relatively high SNR, and high temporal resolution (often covering central k-space region), and another data set (called "imaging" data, denoted as $D_2$) with extended k-space coverage to achieve high spatial resolution. The "imaging" data can sample k-space and/or time sparsely with or without signal averaging to achieve high-speed data acquisition. One exemplary practical implementation of the disclosed data acquisition strategy is illustrated in FIGS. 2A and 2B: where the above mentioned two features (acquisition of $D_1$ and $D_2$) are emphasized: FIG. 2A—acquisition of a data set, $D_1$ (with relatively high SNR and temporal resolution), which are used for determination of the temporal (or spectral) basis, and FIG. 2B—acquisition of a data set, $D_2$ (with extended k-space coverage), for determination of the spatial coefficients (in high spatial resolution). Note that acquisition of $D_1$ and $D_2$ can be done separately or together in a time-interleaved fashion. $D_1$ and $D_2$ can also collected in many sampling trajectories (e.g., CSI, EPSI, spirals, etc.). The pulse sequence shown in FIGS. 3A and 3B is just an illustration of the disclosed data acquisition method.

Referring to FIGS. 2A and 2B, one example of (k,t)-space sampling for the disclosed method is illustrated for 2D spectroscopic imaging ($k_x$ extends into and out of the graphical illustrations). FIG. 2A shows (k,t)-space sampling for data in $D_1$ for subspace estimation 200. In this example, $D_1$ covers a limited region 202 of central k-space for SNR considerations (but not necessarily), and the free sampling or precession period ($T_{A,1}$) 204 is fully sampled to capture the spectral information. FIG. 2B shows (k,t)-space sampling for data in $D_2$ covering an extended k-space for determination of the spatial coordinates 206. Note that a set of FIDs (referring to Free Induction Decay) with different echo shifts ($\Delta\tau_1$, $\Delta\tau_2$, . . . , $\Delta\tau_q$) collected, each of which traverses the entire k-space 208 but with limited spectral encoding or sampling period ($T_{A,2}$) 210. Thus, a first dataset $D_1$ is acquired with a first k-space coverage over a limited region 202, which is obtained over a first temporal sampling period 204, and a second dataset $D_2$ is acquired over a k-space coverage 208 that is greater than that of first dataset $D_1$ but with a lesser temporal sampling period 210 than the free sampling or precession period ($T_{A,1}$) 204 of first dataset $D_1$.

Chemical shift is the phenomenon that is seen when an isotope possessing a nuclear magnetic dipole moment resonates at a spectrum of resonance frequencies in a given magnetic field. These resonance frequencies, or chemical shifts, depend on the chemical environments of particular nuclei. Mapping the spatial distribution of nuclei associated with a particular chemical shift (e.g., hydrogen nuclei associated with water molecules or with lipid groups) is called chemical shift imaging.

Chemical shift imaging (CSI) is an extension of MR spectroscopy, allowing metabolite information to be measured in an extended region and to add the chemical analysis of body tissues to the potential clinical utility of magnetic resonance. The spatial location is phase encoded and a spectrum is recorded at each phase encoding step to allow the spectral acquisition in a number of volumes covering the whole sample. CSI provides mapping of chemical shifts, analog to individual spectral lines or groups of lines. Spatial resolution can be in one, two or three dimensions, but with long acquisition times of full 3D CSI. Commonly a slice-selected 2D acquisition is used. The chemical composition of each voxel is represented by spectra, or as an image in which the signal intensity depends on the concentration of an individual metabolite. Alternatively frequency-selective pulses excite only a single spectral component.

There are several known methods of performing CSI, e.g. the inversion recovery method, chemical shift selective imaging sequence, chemical shift insensitive slice selective RF pulse, the saturation method, spatial and chemical shift encoded excitation, and quantitative chemical shift imaging, as examples.

To reduce the relatively long acquisition time required for spatial encoding, fast spectroscopic imaging approaches were introduced. Among them was an echo planar-based encoding technique. In echo planar spectroscopic imaging (EPSI), an alternating current, which simultaneously encodes space and chemical shift (time), is applied along one of the spatial (readout) directions, thereby reducing the phase-encoding dimension by one and increasing speed. Recent advances in gradient hardware, which have increased both the speed of gradient switching and gradient strength achievable and improved eddy current performance of gradients, led to successful implementations of EPSI. EPSI allows for a larger coverage of the k-space, thus permitting a relatively high spatial resolution within practically acceptable acquisition time. When signal-to-noise ratio (SNR) is not a limiting factor, EPSI can be used to obtain spectroscopic images with resolutions comparable to those of anatomical images in practical scan time. Although for most spectroscopic applications the improved spatial resolution afforded by EPSI is not utilized due to SNR limitations, it can be used for imaging applications in which spectroscopic information may be beneficial.

The disclosed data acquisition scheme can be implemented using a hybrid CSI/EPSI pulse sequence, an example of which is shown in FIGS. 3A and 3B. The CSI component is used to generate $D_1$ (with good SNR) while the EPSI component is used to generate $D_2$ (with high data acquisition speed). That is, FIG. 3A illustrates an exemplary CSI used to collect the data in $D_1$ with limited k-space coverage but full spectral encoding. FIG. 3B illustrates an EPSI-like component used to acquire the date in $D_2$ with extended k-space coverage, but with limited spectral encoding.

Figure 4A:
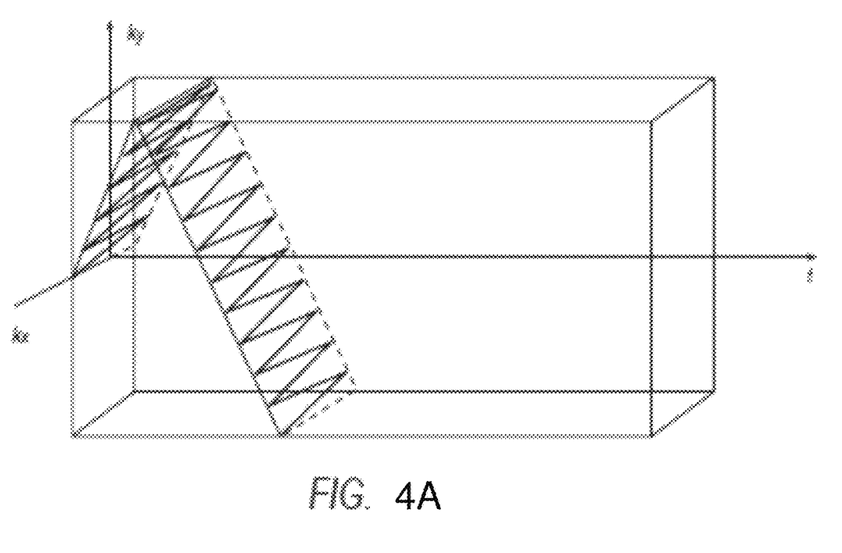
FIGS. 4A and 4B illustrate an exemplary (k,t)-space sampling trajectory (or spatiospectral encoding strategy) that illustrates exemplary aspects of the disclosed method.
Figure 4B:
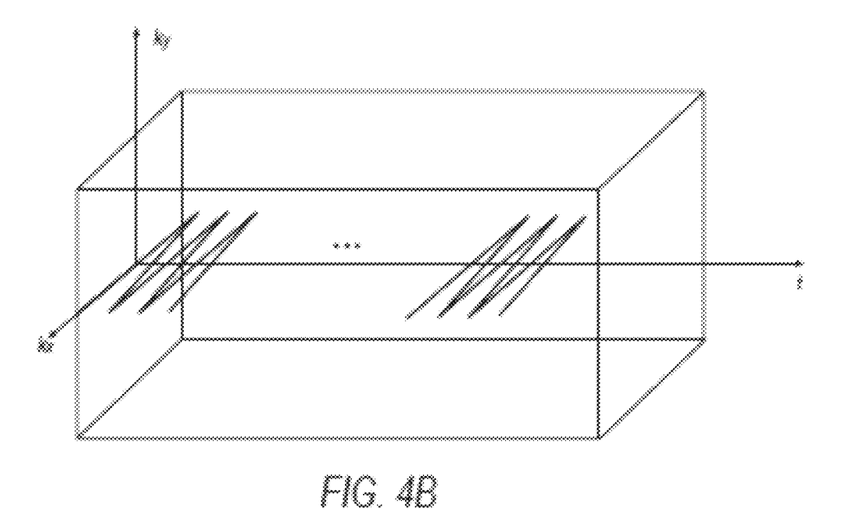

One notable difference occurs, illustrated in FIGS. 4A and 4B, between the EPSI component in the disclosed pulse sequence and a traditional EPSI sequences (used to accelerate CSI). More specifically, traditional EPSI sequences collect data that encode one spatial dimension and the spectral dimension after each excitation while the disclosed sequence is focused on spatial encoding during the free precession period after each excitation and uses echo shifting (of different excitations) for spectral encoding. As a result, the disclosed sequence samples (k,t)-space sparsely. This sparse sampling scheme is enabled by the PS model with temporal basis (capturing the full spectral information), which improves the efficiency of spatiospectral encoding, thus reducing data acquisition time. Note also that the CSI component used to acquire $D_1$ in the disclosed sequence can be replaced by a traditional EPSI scheme if further improvement in data acquisition speed is desired.

Thus, FIGS. 4A and 4B illustrate exemplary (k,t)-space sampling trajectories (or spatiospectral encoding strategies) that illustrates exemplary aspects of the disclosed method. Referring to FIG. 3A, the disclosed method includes spatial encoding along two dimensions during the free precession period after each excitation. In contrast, FIG. 4B illustrates a conventional EPSI sampling trajectory for which full k-space coverage is achieved using multiple excitations but does not require full spectral encoding with the subspace model. The disclosed method, however, as illustrated in FIG. 3A, uses fewer excitations for spatiospectral encoding than conventional EPSI (although, it is contemplated in one embodiment that the EPSI scheme may be used in the disclosed method as well, if data acquisition time permits for a specific use). Other exemplary spatiospectral encodings schemes covered by the disclosed method for 2D and 3D MRSI can be found in the Appendix.

Reconstruction from Sparse Data

Assume that $D_1 = \{s_1(k_m, t_n)\}_{m,n=1}^{M_1, N_1}$ and $D_2 = \{s_2(\hat{k}_m, \hat{t}_n)\}_{m,n=1}^{M_2, N_2}$. Based on the exemplary data acquisition scheme illustrated in FIGS. 2 and 3, it is understood that $\{t_n\}_{n=1}^{N_1}$ sample the time interval of interest in high resolution while $\{\hat{t}_n\}_{n=1}^{N_2}$ sample the interval sparsely, and that $\{k_m\}_{m=1}^{M_1}$ cover limited k-space locations while $\{\hat{k}_m\}_{m=1}^{M_2}$ cover the entire desired region of k-space (to provide the necessary spatial resolution). The disclosed method reconstructs $\rho(r,t)$ from the data in $D_1$ and $D_2$ using a two-step procedure: (a) determination of the temporal basis and (b) determination of the spatial coefficients. Note that from here on, we drop the coil index for notational convenience.

Determination of the temporal basis (or temporal subspace), $\{\phi_l(t_n)\}_{l=1}^L$ for n=1, 2, . . . , $N_1$, from $D_1$ is straightforward if the effect of field inhomogeneity $\Delta B(r)$ on $s_1(k_m,t_n)$ is negligible. In practice, $\Delta B(r)$ can be significant, and its effect on $s_1(k_m, t_n)$ should be reduced or removed. Assuming that $\Delta B(r)$ is available (which can be acquired during the MRSI experiment), field inhomogeneity correction on limited k-space spectroscopic data can be done using known methods, such as a penalized maximum-likelihood method, which enables the use of anatomical constraints for improving the correction performance with only limited k-space data. The corrected data, denoted as $\hat{s}_1(k_m,t_n)$, is then used to form an $M_1 \times N_1$ Casorati matrix C $C(\{\hat{s}(k_m, t_n)\}_{m,n=1}^{M_1,N_1})$. The singular value decomposition (SVD) is then applied to this Casorati matrix and its L principal right singular vectors are chosen as $\{\phi_l(t_n)\}_{l=1}^L$.

After $\{\phi_l(t_n)\}$ are determined, the spatial coefficients, $\{c_l(r_m)\}_{l=1}^L$, can be determined from the sparse data in $D_2$ by solving a least-squares problem. For notation convenience, $\{\rho(r_m,t_n)\}_{m,n=1}^{M,N}=\{\Sigma_{l=1}^L c_l(r_m)\phi_l(t_n)\}_{m,n=1}^{M,N}$ is rewritten as $C\Phi$ (with $C\in\mathbb{C}^{M\times L}, \phi\in\mathbb{C}^{L\times N}$ such that $C_{ml}=c_l(r_m)$ and $\Phi_{ln}=\phi_l(t_n)$, where $M=M_2$ and $N=N_1$ for the proposed data acquisition scheme), and use $s_2\in\mathbb{C}^{M_2N_2\times 1}$ to denote the vector containing all the data in $D_2$, $F_B$ to represent the Fourier operator including the $B_0$ field inhomogeneity effect described in Eq. (IV), and $\Pi$ to represent the (k,t)-space sampling operation used for collecting the data in $D_2$. Then, the spatial coefficients can be determined as:

$$\hat{C} = \arg\min_C \|s_2 - \Pi F_B\{C\Phi\}\|_2^2 + \lambda\Psi(C\Phi), \quad (V)$$

where the first term measures the data consistency of a reconstruction, and $\Psi(\bullet)$ is a regularization functional with regularization parameter $\lambda$. There are many choices for $\Psi(\bullet)$ to incorporate prior information about $\rho(r,t)$ or $\rho(r,f)$ (including both quadratic and sparsity-promoting penalties). Thus, the disclosed method includes demonstrating the concept and potential using $\Psi(C\Psi)=\|WDC\Psi\|_F^2$, where D is a finite difference operator and W contains edge weights derived from a high-resolution anatomical image. Integrating this regularization functional into Eq. (V) yields a weighted-l2 regularized least-squares problem that can be solved efficiently. As such, image reconstruction may be done by solving a regularized least-squares optimization problem.

Figure 5:
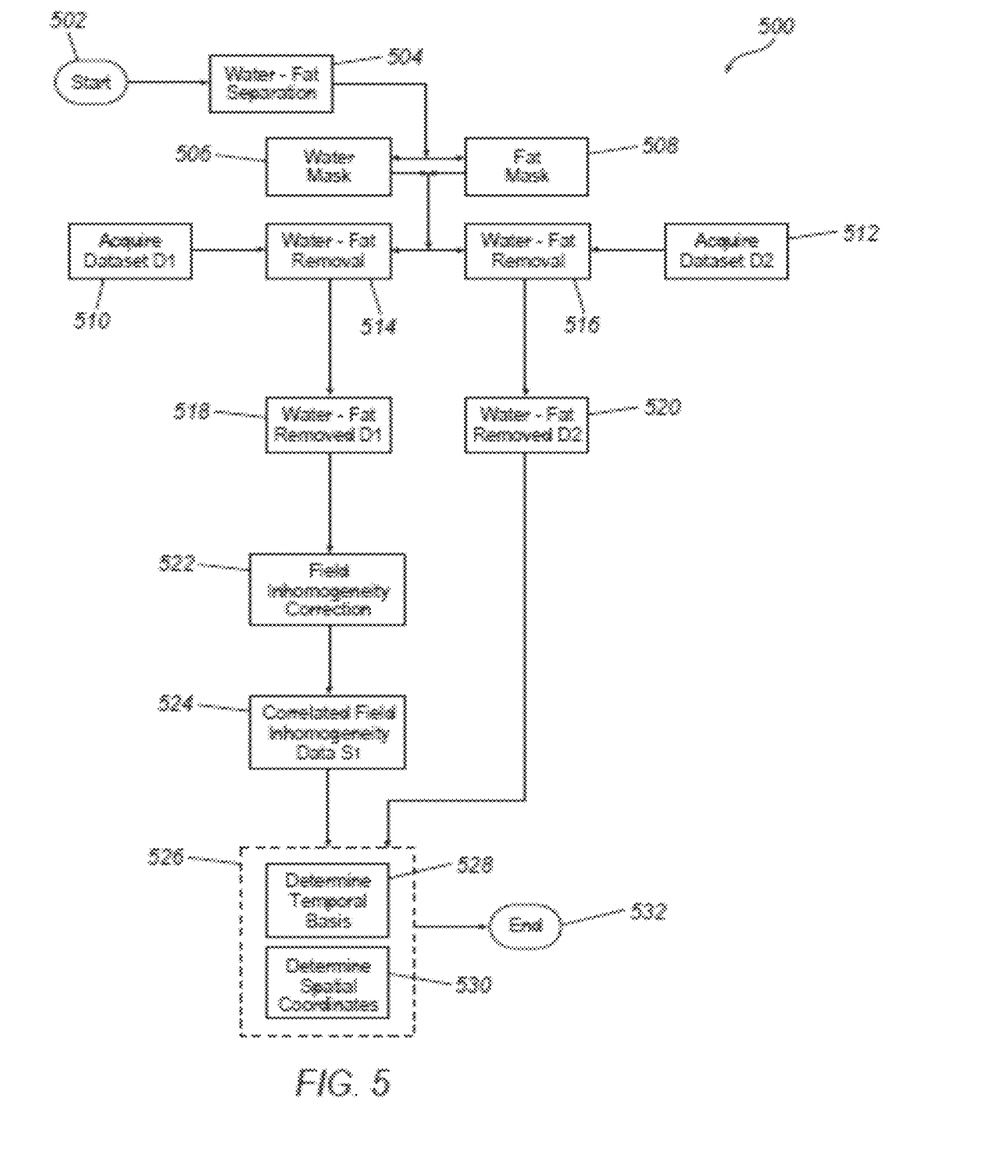
FIG. 5 illustrates exemplary data acquisition and image reconstruction blocks according to the disclosure.

Thus, referring to FIG. 5, process or method 500 starts at step 502 and water-fat separation occurs at step 504. A wide variety of fat suppression and water-fat separation methods are known to suppress fat signal and improve visualization of abnormalities. Commonly known techniques for fat suppression and fat-water imaging include but are not limited to: 1) chemically selective fat suppression pulses "FAT-SAT"; 2) spatial-spectral pulses (water excitation); 3) short inversion time (TI) inversion recovery (STIR) imaging; 4) chemical shift based water-fat separation methods; and finally 5) fat suppression and balanced steady-state free precession (SSFP) sequences. Such methods typically may include generation of a water mask 506 and a fat mask 508. Method 500 also includes acquiring an MRSI dataset $D_1$ at block 510 which, as described above, includes relatively limited k-space coverage and a relatively high temporal resolution. In contrast, block 512 includes acquiring a second MRSI dataset $D_2$ at block 512 that includes a k-space coverage that is greater than that of block 510 for dataset $D_1$, and block 512 also includes a lesser temporal resolution or sampling period than that of block 510 for dataset $D_1$. The water and fat masks acquired at blocks 506 and 508 are used to remove water and fat from the datasets $D_1$ and $D_2$, respectively at blocks 514 and 516. As such, water-fat removed dataset $D_1$ is generated at block 518, and water-fat removed dataset $D_2$ is generated at block 520.

Dataset $D_1$ is corrected for $B_0$ field inhomogeneity, at block 522, and the corrected field inhomogeneity data is generated at block 524. As described and as one example, such field inhomogeneity correction methods may include a penalized maximum-likelihood method, which enables the use of anatomical and/or low-rank constraints for improving the correction performance with only limited k-space data. At block 524, corrected field inhomogeneity data, denoted as $\hat{s}_1(k_m,t_n)$, is generated. In one example, the field inhomogeneity effect is removed using a regularized reconstruction performed on a higher resolution grid.

At block 526 an spatiospectral function is reconstructed using the first and second datasets $D_1$ and $D_2$. That is, datasets $D_1$ and $D_2$ as modified (removal of water-fat of both datasets, and field inhomogeneity correction of $D_1$), are used to reconstruct the spatiospectral (or spatiotemporal) function. Image reconstruction block 526 includes, as described above, a two-step procedure that includes a determination of the temporal basis at block 528, and a determination of the spatial coefficients at block 530. In one example, reconstruction or spatiospectral function generation includes (a) representing a desired spatiotemporal function using a low-rank matrix multiplication model (i.e., the spatial coefficient matrix multiplied with the temporal basis matrix), (b) estimating the spatial coefficients, and (c) forming the final spatiotemporal function by combining the spatial coefficients and the temporal bases. In one example, the spatial coefficients are estimated by solving a regularized least-squares optimization problem with either a quadratic or a non-quadratic regularization function incorporating anatomical information. The process ends at step 532.

In one example, a CSI pulse sequence is used to generate dataset $D_1$, and an EPSI pulse sequence is used to generate dataset $D_2$. However, in one implementation the CSI component used to acquire $D_1$ in the disclosed sequence can be replaced by a traditional EPSI scheme if further improvement in data acquisition speed is desired. And, in some implementations, water-fat separation 504, water and fat mask generation steps 506 and 508, and water-fat removal steps 514 and 516 is not included. That is, water-fat removal is a specific problem for 1H-nuclear MRSI. However, water-fat removal may not be necessary when imaging other nuclei. However, in one example, water and nuisance lipid signals are removed using specialized methods as the first processing step for 1H magnetic resonance spectroscopic imaging experiments.

In one example, the disclosed method included dataset $D_1$ containing 8×8 CSI encodings, each with 512 FID samples, $D_2$ containing 64 echo shifts each having 128×128 spatial encodings and L=10. A CSI reconstruction included 12×12 spatial encodings while the EPSI reconstruction was obtained from 128×128 spatial encodings, both with 512 FID samples, resulting in improved resolution and SNR. The disclosed method achieves, in one example, both high spatial resolution (2.5 mm in plane) and improved SNR with comparable acquisition time. It is noted that the disclosed method includes a reconstruction having comparable resolution to a high-resolution CSI, having in one example a factor of 10 acceleration in data acquisition. In one observation, if a full (instead of sparsely sampled) (k,t)-space EPSI data set is collected for determination of the spatial coefficients, then the disclosed is equivalent to subspace denoising.

A technical contribution for the disclosed method and apparatus is that it provides for a computer-implemented apparatus and method for improving MR spectroscopic imaging.

In accordance with one embodiment, a device to acquire magnetic spectroscopic resonance imaging (MRSI) images includes a plurality of gradient coils positioned about a bore of a magnet, an RF transceiver controlled by a pulse module to transmit RF signals to an RF coil assembly and receive imaging data, and a computer. The computer can be programmed to acquire MRSI data with sparse sampling of (k,t)-space in variable density and SNR. The data can be rearranged to give one set with relatively high SNR and temporal resolution and another set with extended k-space coverage to provide the desired spatial resolution, wherein the second data set may have sparse sampling in both k-space and time to reduce data acquisition time depending on the practical experimental requirements, and reconstruct an spatiospectral function from the acquired MRSI data.

In accordance with another embodiment, a method of magnetic resonance spectroscopic imaging (MRSI) includes acquiring MRSI data covering a (k,t)-space sparsely with variable density and SNR, and generating a spatiospectral function using PS/low-rank models from the acquired data.

An implementation of system 100 in an example comprises a plurality of components such as one or more of electronic components, hardware components, and/or computer software components. A number of such components can be combined or divided in an implementation of the system 100. An exemplary component of an implementation of the system 100 employs and/or comprises a set and/or series of computer instructions written in or implemented with any of a number of programming languages, as will be appreciated by those skilled in the art. An implementation of system 100 in an example comprises any (e.g., horizontal, oblique, or vertical) orientation, with the description and figures herein illustrating an exemplary orientation of an implementation of the system 100, for explanatory purposes.

An implementation of system 100 in an example employs one or more computer readable signal bearing media. A computer-readable signal-bearing medium in an example stores software, firmware and/or assembly language for performing one or more portions of one or more implementations. An example of a computer-readable signal-bearing medium for an implementation of the system 100 comprises the recordable data storage medium of the image processor 122, and/or CPU 124. A computer-readable signal-bearing medium for an implementation of the system 100 in an example comprises one or more of a magnetic, electrical, optical, biological, and/or atomic data storage medium. For example, an implementation of the computer-readable signal-bearing medium comprises floppy disks, magnetic tapes, CD-ROMs, DVD-ROMs, hard disk drives, and/or electronic memory. In another example, an implementation of the computer-readable signal-bearing medium comprises a modulated carrier signal transmitted over a network comprising or coupled with an implementation of the system 100, for instance, one or more of a telephone network, a local area network ("LAN"), a wide area network ("WAN"), the Internet, and/or a wireless network.

Figure 6A:
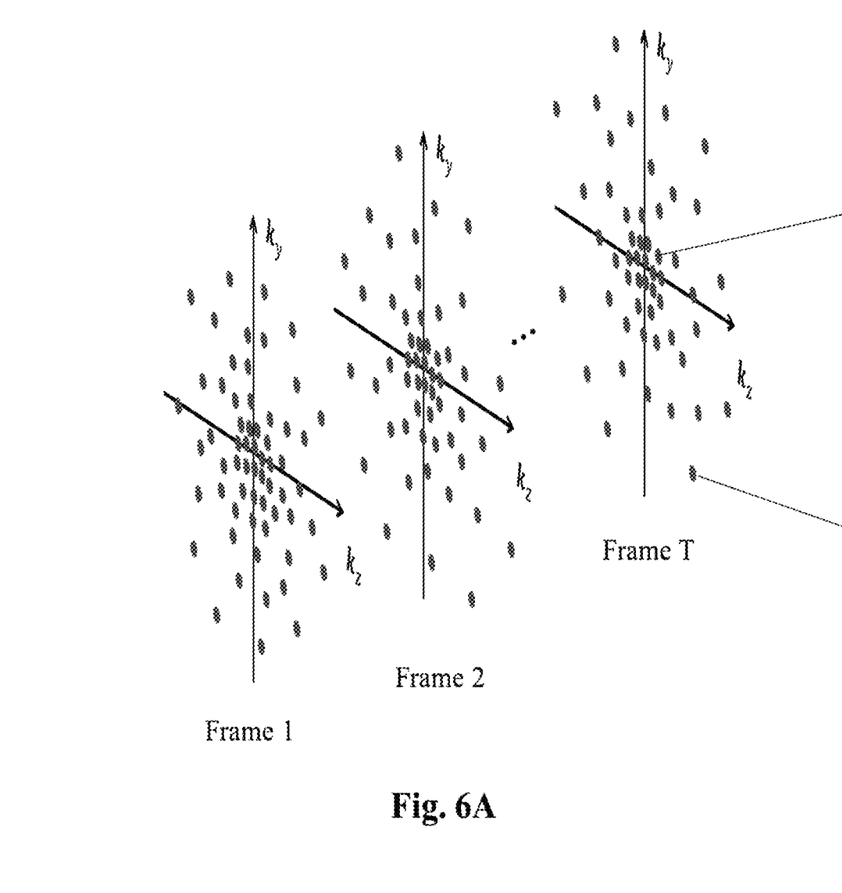
FIG. 6A illustrates another exemplary (k,t)-space sampling for 3D MRSI, wherein $D_1$ and $D_2$ are acquired in a time-interleaved fashion. One spatiospectral function can be obtained from data corresponding to each frame in the figure. The $(k_x,t)$ sampling is shown in FIG. 6B.

FIG. 6A illustrates another exemplary (k,t)-space sampling for 3D MRSI, wherein $D_1$ and $D_2$ are acquired in a time-interleaved fashion. One spatiospectral function can be obtained from data corresponding to each frame in the figure. The $(k_x,t)$ sampling is shown in FIG. 6B.

Figure 6B:
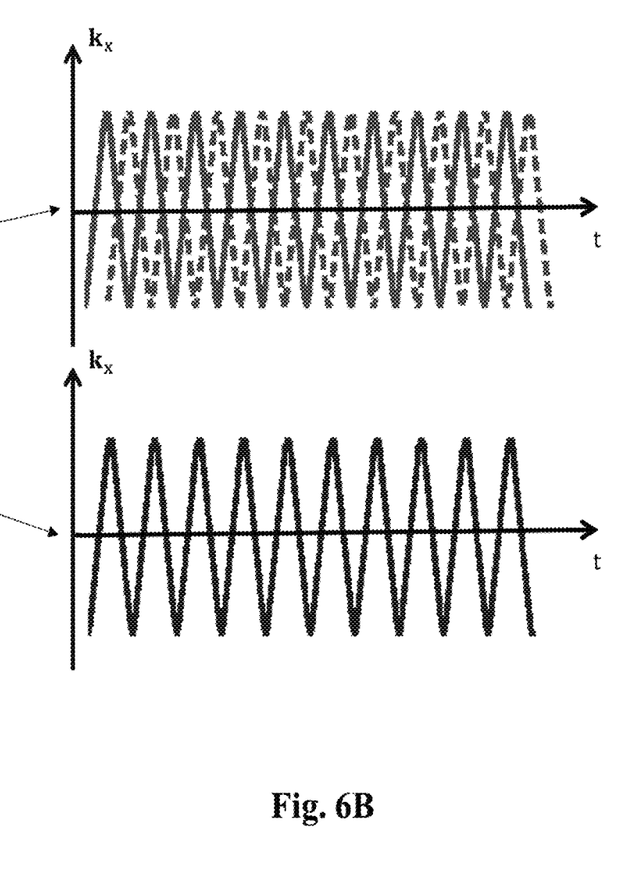
FIG. 6B illustrates exemplary $(k_x,t)$-space sampling for different dots in FIG. 6A. The locations near central $(k_y,k_z)$-plane have denser temporal sampling while the locations further away from central $(k_y,k_z)$-plane have sparser temporal sampling.

FIG. 6B illustrates exemplary $(k_x,t)$-space sampling for different dots in FIG. 6A. The locations near central $(k_y,k_z)$-plane have denser temporal sampling while the locations further away from central $(k_y,k_z)$-plane have sparser temporal sampling.

When introducing elements of various embodiments of the present invention, the articles "a," "an," "the," and "said" are intended to mean that there are one or more of the elements. The terms "comprising," "including," and "having" are intended to be inclusive and mean that there may be additional elements other than the listed elements. Furthermore, any numerical examples in the following discussion are intended to be non-limiting, and thus additional numerical values, ranges, and percentages are within the scope of the disclosed embodiments.

Dedicated hardware implementations including, but not limited to, application specific integrated circuits, programmable logic arrays and other hardware devices can likewise be constructed to implement the methods described herein. Application specific integrated circuits and programmable logic array can use downloadable instructions for executing state machines and/or circuit configurations to implement embodiments of the subject disclosure. Applications that may include the apparatus and systems of various embodiments broadly include a variety of electronic and computer systems. Some embodiments implement functions in two or more specific interconnected hardware modules or devices with related control and data signals communicated between and through the modules, or as portions of an application-specific integrated circuit. Thus, the example system is applicable to software, firmware, and hardware implementations.

In accordance with various embodiments of the subject disclosure, the operations or methods described herein are intended for operation as software programs or instructions running on or executed by a computer processor or other computing device, and which may include other forms of instructions manifested as a state machine implemented with logic components in an application specific integrated circuit or field programmable gate array. Furthermore, software implementations (e.g., software programs, instructions, etc.) including, but not limited to, distributed processing or component/object distributed processing, parallel processing, or virtual machine processing can also be constructed to implement the methods described herein. It is further noted that a computing device such as a processor, a controller, a state machine or other suitable device for executing instructions to perform operations or methods may perform such operations directly or indirectly by way of one or more intermediate devices directed by the computing device.

While the tangible computer-readable storage medium is an example embodiment as a single medium, the term "tangible computer-readable storage medium" should be taken to include a single medium or multiple media (e.g., a centralized or distributed database, and/or associated caches and servers) that store the one or more sets of instructions. The term "tangible computer-readable storage medium" shall also be taken to include any non-transitory medium that is capable of storing or encoding a set of instructions for execution by the machine and that cause the machine to perform any one or more of the methods of the subject disclosure. The term "non-transitory" as in a non-transitory computer-readable storage includes without limitation memories, drives, devices and anything tangible but not a signal per se.

The term "tangible computer-readable storage medium" shall accordingly be taken to include, but not be limited to: solid-state memories such as a memory card or other package that houses one or more read-only (non-volatile) memories, random access memories, or other re-writable (volatile) memories, a magneto-optical or optical medium such as a disk or tape, or other tangible media which can be used to store information. Accordingly, the disclosure is considered to include any one or more of a tangible computer-readable storage medium, as listed herein and including art-recognized equivalents and successor media, in which the software implementations herein are stored.

Although the present specification describes components and functions implemented in the embodiments with reference to particular standards and protocols, the disclosure is not limited to such standards and protocols. Each of the standards for Internet and other packet switched network transmission (e.g., TCP/IP, UDP/IP, HTML, HTTP, CoAP, MQTT) represent examples of the state of the art. Such standards are from time-to-time superseded by faster or more efficient equivalents having essentially the same functions. Wireless standards for device detection (e.g., RFID), short-range communications (e.g., Bluetooth®, WiFi, Zigbee®), and long-range communications (e.g., WiMAX, GSM, CDMA, LTE) can be used by a computer system to implement one or more functions described herein.

The illustrations of embodiments described herein are intended to provide a general understanding of the structure of various embodiments, and they are not intended to serve as a complete description of all the elements and features of apparatus and systems that might make use of the structures described herein. Many other embodiments will be apparent to those of skill in the art upon reviewing the above description. The exemplary embodiments can include combinations of features and/or steps from multiple embodiments. Other embodiments may be utilized and derived therefrom, such that structural and logical substitutions and changes may be made without departing from the scope of this disclosure. Figures are also merely representational and may not be drawn to scale. Certain proportions thereof may be exaggerated, while others may be minimized. Accordingly, the specification and drawings are to be regarded in an illustrative rather than a restrictive sense.

Although specific embodiments have been illustrated and described herein, it should be appreciated that any arrangement which achieves the same or similar purpose may be substituted for the embodiments described or shown by the subject disclosure. The subject disclosure is intended to cover any and all adaptations or variations of various embodiments. Combinations of the above embodiments, and other embodiments not specifically described herein, can be used in the subject disclosure. For instance, one or more features from one or more embodiments can be combined with one or more features of one or more other embodiments. In one or more embodiments, features that are positively recited can also be negatively recited and excluded from the embodiment with or without replacement by another structural and/or functional feature. The steps or functions described with respect to the embodiments of the subject disclosure can be performed in any order. The steps or functions described with respect to the embodiments of the subject disclosure can be performed alone or in combination with other steps or functions of the subject disclosure, as well as from other embodiments or from other steps that have not been described in the subject disclosure. Further, more than or less than all of the features described with respect to an embodiment can also be utilized.

Less than all of the steps or functions described with respect to the exemplary processes or methods can also be performed in one or more of the exemplary embodiments. Further, the use of numerical terms to describe a device, component, step or function, such as first, second, third, and so forth, is not intended to describe an order or function unless expressly stated so. The use of the terms first, second, third and so forth, is generally to distinguish between devices, components, steps or functions unless expressly stated otherwise. Additionally, one or more devices or components described with respect to the exemplary embodiments can facilitate one or more functions, where the facilitating (e.g., facilitating access or facilitating establishing a connection) can include less than every step needed to perform the function or can include all of the steps needed to perform the function.

In one or more embodiments, a processor (which can include a controller or circuit) has been described that performs various functions. It should be understood that the processor can be multiple processors, which can include distributed processors or parallel processors in a single machine or multiple machines. The processor can be used in supporting a virtual processing environment. The virtual processing environment may support one or more virtual machines representing computers, servers, or other computing devices. In such virtual machines, components such as microprocessors and storage devices may be virtualized or logically represented. The processor can include a state machine, application specific integrated circuit, and/or programmable gate array including a Field PGA. In one or more embodiments, when a processor executes instructions to perform "operations", this can include the processor performing the operations directly and/or facilitating, directing, or cooperating with another device or component to perform the operations.

The Abstract of the Disclosure is provided with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

While the disclosure has been described in detail in connection with a limited number of embodiments, it should be readily understood that the invention is not limited to such disclosed embodiments. Rather, that disclosed can be modified to incorporate any number of variations, alterations, substitutions or equivalent arrangements not heretofore described, but which are commensurate with the spirit and scope of the invention. Furthermore, while single energy and dual-energy techniques are discussed above, that disclosed encompasses approaches with more than two energies. Additionally, while various embodiments of the invention have been described, it is to be understood that disclosed aspects may include only some of the described embodiments. Accordingly, that disclosed is not to be seen as limited by the foregoing description, but is only limited by the scope of the appended claims.

One or more of the exemplary embodiments can include a device to acquire MRSI data. The device can include a plurality of gradient coils positioned about a bore of a magnet; an RF transceiver controlled by a pulse module to transmit RF signals to an RF coil assembly and receive imaging data; and a computer. The computer can be programmed to acquire MRSI data with sparse sampling of (k,t)-space in variable density and SNR. The data can be rearranged to give one set with relatively high SNR and temporal resolution and another set with extended k-space coverage (may be with sparse sampling in both k-space and time to reduce data acquisition time depending on the practical experimental requirements). The computer can reconstruct the desired spatiospectral function from the acquired MRSI data to provide biochemical information of the object being imaged.

In one embodiment, the computer can be further programmed to reconstruct the spatiospectral function by first determining a temporal basis and then determining spatial coefficients. Joint determination of the temporal (spectral) basis and the spatial coefficients is also possible using a variation of the disclosed method. If the temporal (spectral) basis is known (or predetermined in a different experiment, or based on prior knowledge), it is also possible to eliminate the step of determining the basis in the disclosed method. In one embodiment, the computer can reduce the effect of field inhomogeneity by mapping the field in homogeneity and then determine the temporal (or spectral) basis based on the mapped field inhomogeneity. In one embodiment, the computer can reconstruct the spatio spectral function by estimating a set of temporal basis functions from field inhomogeneity-corrected data and using the estimated temporal basis functions to reconstruct the spatiospectral function. In one embodiment, the computer can use a chemical shift imaging pulse sequence to generate the first data set, wherein the pulse sequence is one of a 2D or a 3D pulse sequence. In one embodiment, the computer can use an echo-planar spectroscopic imaging pulse sequence for rapid acquisition of spatiospectral encodings, where the pulse sequence is one of a 2D or a 3D pulse sequence. In one embodiment, the computer can generate fat-water images; separate water and fat; generate a water mask and a fat mask; and remove water and fat from the acquired MRSI data using the water mask and the fat mask. In one embodiment, the computer can reconstruct the spatiospectral function using a regularized least-squares optimization. In one embodiment, the computer can reconstruct the spatiospectral function by representing a desired function using a low-rank matrix multiplication model; estimating spatial coefficients; and forming the final spatiospectral function by combining the spatial coefficients and temporal bases.

One or more of the exemplary embodiments can be a method of MRSI. The method can include acquiring MRSI data with relatively high SNR and temporal resolution suitable for determination of temporal (or spectral basis) used in a subspace (or low-rank matrix/tensor) model; acquiring MRSI data with extended k-space coverage to give high spatial resolution.

In one embodiment, the method can include determining a temporal basis based on the MRSI data with relatively high SNR and temporal resolution; and determining spatial coefficients based on MRSI data with extended k-space coverage. In one embodiment, the method can include mapping the field inhomogeneity to reduce the effect of field inhomogeneity; and determining the temporal basis based on the mapped field inhomogeneity. In one embodiment, the method can include estimating a set of temporal basis functions from field inhomogeneity-corrected data; and using the estimated temporal basis functions to generate the desired spatiospectral function. In one embodiment, the method can include acquiring MRSI data with relatively high SNR and temporal resolution using a chemical shift imaging pulse sequence, where the pulse sequence is one of a 2D or a 3D CSI pulse sequence. In one embodiment, the method can include acquiring MRSI data with extended k-space coverage using an echo-planar spectroscopic imaging pulse sequence, where the pulse sequence is one of a 2D or a 3D pulse sequence. In one embodiment, the method can include generating fat-water echo images; separating water and fat; generating a water mask and a fat mask; and removing water and fat from the acquired MRSI data. In one embodiment, the method can include reconstructing the spatiospectral function using a regularized least-squares optimization. In one embodiment, the method can include reconstructing the spatiospectral function by representing a desired spatiotemporal function using a low-rank matrix (or tensor) multiplication model; estimating spatial coefficients; and forming the final spatiospectral function by combining the spatial coefficients and temporal bases.

In one embodiment, the regularization terms are either quadratic or nonquadratic. In one embodiment, the spatial support information is incorporated into the optimization problems. In one embodiment, the optimization problems can be solved by solving a system of linear equations if the regularization term is quadratic. In one embodiment, the computer is further programmed to generate: i) a set of anatomical images; and ii) a set of field inhomogeneity maps to be used in processing and reconstruction schemes. In one embodiment, the MRSI data are acquired at different echo times (in a time-interleaved data acquisition strategy). In one embodiment, the above described methods are used to acquire and process MRSI data from multiple coils. In one embodiment, acquisition and reconstruction is performed on systems with different magnetic field strengths. In one embodiment, spatiospectral functions are generated for chemical species from one or more of the following nuclei: $^1$H, $^{31}$P, $^{19}$F, $^{13}$C, $^7$Li, $^{15}$N, $^{17}$O, $^{19}$F, $^{23}$Na, and $^{129}$Xe.

One unique feature of the disclosed data acquisition strategy is variable sampling densities in (k,t)-space to enable high-speed MRSI data acquisition with sparse sampling in k-space and/or time; another unique feature of the disclosed sampling patterns is that it enables the use of subspace (or low-rank matrix or tensor) models to recover high-quality, high-resolution spatiospectral functions from sparsely sampled (k,t)-space MRSI data. The MRSI data collected using such sampling schemes can be rearranged in multiple ways. One way is to organize the acquired MRSI data into two data sets: one data set (called "training" data, denoted as $D_1$) with relatively high SNR, and high temporal resolution (often covering central k-space region), and another data set (called "imaging" data, denoted as $D_2$) with extended k-space coverage to achieve high spatial resolution. The "imaging" data can sample k-space and/or time sparsely with or without signal averaging to achieve high-speed data acquisition.

One or more of the exemplary embodiments can utilize one or more features of the imaging systems and/or imaging methods described in Appendix A of U.S. Provisional Application 62/102,315, filed Jan. 12, 2015, the disclosure of which is hereby incorporated by reference herein in its entirety. The one or more features of the imaging systems and/or imaging methods described in Appendix A can be utilized in place of and/or in addition to one or more features described herein with respect to the exemplary embodiments.

What is claimed is:

1. A device to acquire spatiospectral information from an object, the device comprising:
   a magnetic field generator that generates a static magnetic field, the object being positioned in the static magnetic field;
   an RF coil assembly including a plurality of gradient coils;
   an RF transceiver controlled by a pulse module that transmits RF signals to the RF coil assembly and that receives magnetic resonance (MR) signals; and
   a computer which, responsive to executing instructions, performs operations, the operations comprising:
      acquiring, from the MR signals, spatiospectral encoded training data, wherein the training data has been sampled at a first temporal resolution, and wherein the training data has a first k-space coverage;
      acquiring, from the MR signals, spatiospectral encoded imaging data, wherein the imaging data has been sampled at a second temporal resolution, wherein the second temporal resolution is less than the first temporal resolution, wherein the imaging data has a second k-space coverage, and wherein the second k-space coverage is greater than the first k-space coverage; and
      reconstructing one or more spatiospectral functions from the training data and the imaging data.

2. The device of claim 1, wherein image data are acquired based upon a subspace model that uses the following decomposition of the one or more spatiospectral functions explicitly or implicitly:

$$\rho(x_1, x_2, \ldots, x_d) = \Sigma_{l_1=1}^{L_1} \Sigma_{l_2=1}^{L_2} \ldots \Sigma_{l_d=1}^{L_d} c_{l_1 l_2 \ldots l_d} \phi_{l_1}(x_1) \phi_{l_2}(x_2) \ldots \phi_{l_d}(x_d),$$

wherein $x_1, x_2, \ldots x_{\hat{d}}$ are $\hat{d}$ separable groups of a first complete set of variables $x_1, x_2, \ldots, x_d$ for an image domain, such that $x_i = (x_{i_1}, x_{i_2}, \ldots x_{i_m})$;
   wherein a data space is sampled according to:

$$s(k_{x_1}, k_{x_2}, \ldots, k_{x_{\hat{d}}}) = \int\int \ldots \int \rho(x_1, x_2, \ldots, x_{\hat{d}}) e^{-i2\pi(k_{x_1}\cdot x_1 + k_{x_2}\cdot x_2 + \ldots + k_{x_{\hat{d}}}\cdot x_{\hat{d}})} dx_1 dx_2 \ldots dx_{\hat{d}},$$

wherein $k_{x_1}, k_{x_2}, \ldots, k_{x_{\hat{d}}}$ are $\hat{d}$ separable groups of a second complete set of variables $k_1, k_2, \ldots, k_d$ for the data space, such that $k_{x_i} = (k_{i_1}, k_{i_2}, \ldots k_{i_m})$;
   wherein the training data and the imaging data specify different subspaces $\{\phi_{l_i}(x_i)\}_{l_i=1}^{L_i}$ for $i=1, 2, \ldots, \hat{d}$ and $\{c_{l_1 l_2 \ldots l_{\hat{d}}}\}$;
   wherein the training data and the imaging data are acquired based on different characteristics of the different subspaces, and
   wherein the decomposition of the one or more spatiospectral functions into partially separable functions are expressable as low-rank matrices or low-rank tensors.

3. The device of claim 2, wherein the training data has high SNR, and wherein the imaging data provides for extended k-space coverage to achieve high spatial resolution.

4. The device of claim 3, wherein image reconstruction is performed based on the subspace model by determining at least one of subspaces $\{\phi_{l_i}(x_i)\}_{l_i=1}^{L_i}$ or coefficients $c_{l_1 l_2 \ldots l_{\hat{d}}}$ for $i=1, 2, \ldots, \hat{d}$.

5. The device of claim 4, wherein the operations further comprise determining, for 2D and 3D magnetic resonance spectroscopic imaging, a temporal/spectral subspace of $\{\psi_l(t)\}_{l=1}^{L}$ or $\{\psi_l(f)\}_{l=1}^{L}$ from the training data, and then determining a set of spatial coefficients $\{c_l(r)\}_{l=1}^{L}$ from the imaging data.

6. The device of claim 5, wherein field inhomogeneity effects are removed from the training data to generate $B_0$ field inhomogeneity corrected training data and $\{\psi_l(t)\}_{l=1}^{L}$ or $\{\psi_l(f)\}_{l=1}^{L}$ is determined from the $B_0$ field inhomogeneity corrected training data.

7. The device of claim 6, wherein the field inhomogeneity effects are removed by solving an optimization problem of $$\hat{\rho} = \arg \min_{\rho} \|s_1 - \Omega_1\{F_B\rho\}\|_2^2 + \lambda_1 R_1(\rho),$$

wherein $\|\cdot\|_2^2$ is a data consistency term, $R_1(\cdot)$ is a regularization term with regularization parameter $\lambda_1$, $\hat{\rho}$ is a field inhomogeneity corrected reconstruction, $s_1$ is a vector containing data from the training data, $\Omega_1$ is a sampling operator determined by a sampling pattern of the training data and $F_B$ is a Fourier encoding operator incorporating the field inhomogeneity effects.

8. The device of claim 2, wherein the subspace model is decomposed to include nuisance water and fat signal components, wherein subspace and corresponding spatial coefficients are further specified for 2D and 3D magnetic resonance spectroscopic imaging (MRSI) as: $\{\psi_{l_W}(t)\}_{l_W=1}^{L_W}$ or $\{\psi_{l_W}(f)\}_{l_W=1}^{L_W}$ and $\{c_{l_W}(r)\}_{l_W=1}^{L_W}$ for water signal, $\{\psi_{l_F}(t)\}_{l_F=1}^{L_F}$ or $\{\psi_{l_F}(f)\}_{l_F=1}^{L_F}$ and $\{c_{l_F}(r)\}_{l_F=1}^{L_F}$ for fat signal, and $\{\psi_{l_M}(t)\}_{l_M=1}^{L_M}$ or $\{\psi_{l_M}(f)\}_{l_M=1}^{L_M}$ and $\{c_{l_M}(r)\}_{l_M=1}^{L_M}$ for metabolite signal.

9. The device of claim 4, wherein the operations further comprise determining, for 2D and 3D magnetic resonance spectroscopic imaging, a temporal/spectral subspace of $\{\psi_l(t)\}_{l=1}^{L}$ or $\{\psi_l(f)\}_{l=1}^{L}$ and spatial coefficients $(\{c_l(r)\}_{l=1}^{L})$ jointly from a hybrid data set containing both the training data and the imaging data.

10. The device of claim 5, wherein $\{c_l(r)\}_{l=1}^{L}$ is determined from the imaging data by solving an optimization problem $$\hat{C} = \arg \min_{C} \|s_2 - \Omega_2\{F_B C\Psi\}\|_2^2 + \lambda_2 R_2(C, \Psi),$$

wherein $\|\cdot\|_2^2$ is a data consistency term, $R_2(\cdot)$ is a regularization term with regularization parameter $\lambda_2$, $\hat{C}$ is a matrix containing estimated spatial coefficients, $s_2$ is a vector containing data from the imaging data, $\Omega_2$ is a sampling operator determined by a sampling pattern of the imaging data, $\Psi$ is a matrix whose rows are discretization of $\{\psi_l(t)\}_{l=1}^{L}$ or $\{\psi_l(f)\}_{l=1}^{L}$ and $C\Psi$ is a matrix representation of a spatiotemporal/spatiospectral function of interest.

11. The device of claim 5, wherein for 1H magnetic resonance spectroscopic imaging use, $\{c_{l_W}(r)\}_{l_W=1}^{L_W}$, $\{c_{l_F}(r)\}_{l_F=1}^{L_F}$, and $\{c_{l_M}(r)\}_{l_M=1}^{L_M}$ which decompose $\{c_l(r)\}_{l=1}^{L}$ are determined from the imaging data by solving an optimization problem $$\hat{C}_W, \hat{C}_F, \hat{C}_M = \arg\min_{C_W, C_F, C_M} \|s_2 - \Omega_2\{F_B(C_W\Psi_W + C_F\Psi_F + C_M\Psi_M)\}\|_2^2 +$$

$$\lambda_{2W}R_{2W}(C_W, \Psi_W) + \lambda_{2F}R_{2F}(C_F, \Psi_F) + \lambda_{2M}R_{2M}(C_M, \Psi_M),$$

wherein $\|\cdot\|_2^2$ is a data consistency term; $R_{2W}(\cdot)$, $R_{2F}(\cdot)$ and $R_{2M}(\cdot)$ are regularization terms with regularization parameters $\lambda_{2W}$, $\lambda_{2F}$ and $\lambda_{2M}$, respectively; $\hat{C}_W$, $\hat{C}_F$, and $\hat{C}_M$ are matrices containing the estimated spatial coefficients of water, fat and metabolite signals, respectively; $s_2$ is a vector containing data from the imaging data; $\Omega_2$ is a sampling operator, determined by a sampling pattern of the imaging data, $\Psi_W$, $\Psi_F$, and $\Psi_M$ are matrices whose rows are discretization of $\{\psi_{l_W}(t)\}_{l_W=1}^{L_W}$, $\{\psi_{l_F}(t)\}_{l_F=1}^{L_F}$, and $\{\psi_{l_M}(t)\}_{l_M=1}^{L_M}$ or $(\{\psi_{l_W}(f)\}_{l_W=1}^{L_W}$, $\{\psi_{l_F}(f)\}_{l_F=1}^{L_F}$, and $\{\psi_{l_M}(f)\}_{l_M=1}^{L_M})$; $C_W\Psi_W$, $C_F\Psi_F$, and $C_M\Psi_M$ are a matrix representation of spatiotemporal/spatiospectral functions of the water, fat and metabolite signals.

12. The device of claim 1, wherein the training data is acquired using a chemical-shift imaging (CSI) sequence, a low-bandwidth echo-planar spectroscopic imaging (EPSI) sequence or a low-bandwidth spiral sequence under a condition that the training data thus collected is suitable for a determination of a temporal basis of a subspace model, a spectral basis of the subspace model, or a combination thereof.

13. The device of claim 1, wherein the imaging data is acquired using an echo-planar spectroscopic imaging (EPSI) sequence or a spiral sequence under a condition that trajectories generated by sequences cover an extended k-space specified by a desired spatial resolution.

14. The device of claim 13, wherein magnetic field gradients along different directions x, y and z are simultaneously applied or alternatively applied during each trajectory of the EPSI and spiral sequences.

15. The device of claim 14, wherein a sequence of time delays ($\tau_1, \tau_2, \ldots, \tau_s$) are inserted before each trajectory, wherein the time delays are either uniformly spaced or randomly spaced.

16. The device of claim 1, wherein the training data and the imaging data are acquired separately or together in a time-interleaved fashion.

17. The device of claim 1, wherein for 1H magnetic resonance spectroscopic imaging use, the training data and the imaging data are acquired in two modes with nuisance water and fat signal suppression pulses on or off.

18. The device of claim 1, wherein for 1H magnetic resonance spectroscopic imaging use, the training data and the imaging data are processed to remove nuisance water and fat signals in the training data and in the imaging data.

19. The device of claim 1, wherein the operations further comprise generating: i) a set of anatomical images; and ii) a set of field inhomogeneity maps, wherein the MR signals are acquired at different echo times using either gradient-echo based sequences or spin-echo based sequences.

20. A method of acquiring spatiospectral information from an object, the method comprising:
generating a static magnetic field, the object being positioned in the static magnetic field;
controlling an RF transceiver to transmit RF signals to an RF coil assembly including a plurality of gradient coils;
controlling the RF transceiver to receive magnetic resonance (MR) signals;
acquiring, from the MR signals, spatiospectral encoded training data, wherein the training data has been sampled at a first temporal resolution, and wherein the training data has a first k-space coverage;
acquiring, from the MR signals, spatiospectral encoded imaging data, wherein the imaging data has been sampled at a second temporal resolution, wherein the second temporal resolution is less than the first temporal resolution, wherein the imaging data has a second k-space coverage, and wherein the second k-space coverage is greater than the first k-space coverage; and
reconstructing a spatiospectral function from the training data and the imaging data.

21. A non-transitory computer-readable storage medium comprising executable instructions which, responsive to being executed by a processor, cause the processor to perform operations, the operations comprising:
acquiring magnetic resonance spectroscopic imaging (MRSI) data comprising spatiospectral encoded training data and spatiospectral encoded imaging data, wherein the training data has been sampled at a first temporal resolution, wherein the training data has a first k-space coverage, wherein the imaging data has been sampled at a second temporal resolution, wherein the second temporal resolution is less than the first temporal resolution, wherein the imaging data has a second k-space coverage, and wherein the second k-space coverage is greater than the first k-space coverage; and
reconstructing a spatiospectral function from the training data and the imaging data;
wherein the acquiring of the MRSI data is performed utilizing an RF coil assembly including a plurality of gradient coils, and an RF transceiver controlled by a pulse module to transmit RF signals to the RF coil assembly.

\* \* \* \* \*